(12) United States Patent
Lye et al.

(10) Patent No.: US 6,476,744 B1
(45) Date of Patent: *Nov. 5, 2002

(54) METHOD AND APPARATUS FOR GENERATING PULSES FROM ANALOG WAVEFORMS

(75) Inventors: Kin M. Lye, Singapore (SG); Jurianto Joe, Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/835,182

(22) Filed: Apr. 13, 2001

(51) Int. Cl.⁷ .................................................. H03M 1/00
(52) U.S. Cl. ........................................ 341/133; 341/111
(58) Field of Search ................................. 341/157, 133, 341/111; 330/284; 331/74; 318/798; 327/514

(56) References Cited

U.S. PATENT DOCUMENTS

| | | | |
|---|---|---|---|
| 3,209,282 A | 9/1965 | Schnitzler | 331/107 |
| 3,239,832 A | 3/1966 | Renard | 340/347 |
| 3,246,256 A | 4/1966 | Sommers, Jr. | 331/107 |
| 3,303,350 A | 2/1967 | Neff et al. | 307/88.5 |
| 3,312,911 A | 4/1967 | De Boer | 331/107 |
| 3,387,298 A | 6/1968 | Kruy | 340/347 |
| 3,527,949 A | 9/1970 | Huth | 250/199 |
| 3,571,753 A | 3/1971 | Saunders | 331/111 |
| 3,755,696 A | 8/1973 | Nicholson et al. | 307/296 |
| 3,761,621 A | 9/1973 | Vollmeyer et al. | 178/50 |
| 3,846,717 A | 11/1974 | Fleming | 332/52 |
| 3,967,210 A | 6/1976 | Aumann | 340/347 |
| 4,028,562 A | 6/1977 | Zuleeg | 331/107 |
| 4,037,252 A | 7/1977 | Jansen | 358/128 |
| 4,365,212 A | 12/1982 | Gentile et al. | 331/111 |
| 4,425,647 A | 1/1984 | Collins et al. | 371/70 |
| 4,459,591 A | 7/1984 | Haubner et al. | 340/825.57 |
| 4,560,949 A | 12/1985 | Young | 330/284 |
| 4,599,549 A | 7/1986 | Mutoh et al. | 318/798 |
| 4,743,906 A | 5/1988 | Fullerton | 342/27 |
| 4,862,160 A | 8/1989 | Ekchian et al. | 340/825.54 |
| 5,012,244 A | 4/1991 | Wellard et al. | 341/143 |
| 5,107,264 A | 4/1992 | Novof | 341/101 |
| 5,170,274 A | 12/1992 | Kuwata et al. | 359/182 |
| 5,337,054 A | 8/1994 | Ross et al. | 342/93 |
| 5,339,053 A | 8/1994 | Lux et al. | 331/99 |
| 5,532,641 A | 7/1996 | Balasubramanian et al. | 329/311 |
| 5,764,702 A | 6/1998 | Caiaffa | 375/316 |
| 5,777,507 A | 7/1998 | Kaminishi et al. | 327/514 |
| 5,789,992 A | 8/1998 | Moon | 332/107 |

(List continued on next page.)

FOREIGN PATENT DOCUMENTS

| | | | |
|---|---|---|---|
| DE | 94 855 | 1/1973 | G01R/19/26 |
| DE | 2459531 A1 | 7/1976 | H03K/3/28 |
| DE | 2602794 A1 | 7/1977 | H03B/5/06 |
| DE | 19809334 A1 | 9/1999 | H03M/1/66 |
| FR | 1438262 A | 7/1966 | H03K/7/08 |
| GB | 1036328 | 7/1966 | H03K/5/08 |
| JP | 11074766 | 3/1999 | H03K/5/00 |

OTHER PUBLICATIONS

Gallerani, A., "Oscillator Meets Three Requirements", EDN Access, pp. 119–120, Dec. 3, 1998.

(List continued on next page.)

Primary Examiner—Peguy JeanPierre
(74) Attorney, Agent, or Firm—Townsend and Townsend and Crew LLP; Kenneth R. Allen (57) ABSTRACT

A method and apparatus that allows an analog waveform to carry multilevel of information is disclosed. This allows information capacity enhancement in pulse decoding communication system by concatenating several information regions in one cycle of analog waveform.

38 Claims, 9 Drawing Sheets

U.S. PATENT DOCUMENTS

| | | | |
|---|---|---|---|
| 5,812,081 A | 9/1998 | Fullerton | 342/21 |
| 5,832,035 A | 11/1998 | Fullerton | 375/210 |
| 5,892,701 A | 4/1999 | Huang et al. | 364/825 |
| 5,901,172 A | 5/1999 | Fontana et al. | 375/200 |
| 6,023,672 A | 2/2000 | Ozawa | 704/222 |
| 6,044,113 A | 3/2000 | Oltean | 375/238 |
| 6,060,932 A | 5/2000 | Devin | 327/298 |
| 6,087,904 A | 7/2000 | Wen | 332/178 |
| 6,259,390 B1 | 7/2001 | Joe | 341/133 |
| 6,275,544 B1 | 8/2001 | Aiello et al. | 375/326 |
| 6,292,067 B1 | 9/2001 | Sasabata et al. | 332/115 |

OTHER PUBLICATIONS

Abell, E., "Gated Oscillator Emulates a Flip–Flop", EDN Access, pp. 1–2, Mar. 16, 1995.

L. Goras et al., "On Linear Inductance–and Capacitance–Time Conversions Using NIC–Type Configuration," IEEE Transactions on Industrial Electronics, .vol. 40, No. 5 pp. 529–531 (Oct. 1993).

V.H. Jakubaschk, "das Grosse Elektronikbastelbuch," Deutscher Militärverlag, Leipzig, pp. 206–209 (1968).

James P. Keener, Analog Circuitry for the van der Pol and FitzHugh—Nagumo Equations, IEEE 1983, pp. 1011–1015.

U. Tietze et al., "Halbleiter–Schaltungstechnik, Fünfte, überarbeitete Auflage," Springer–Verlag, Berlin Heidelberg, New York, pp. 255–258 (1980).

Patarasen, S. et al., Maximum–Likelihood Symbol Synchronization and Detection of OPPM Sequeunces, IEEE Transactions on Communications, New York, US, Jun. 1994, pp. 9, vol. 42, No. 6.

Sen et al., Integration of GaAs/AlAs Resonant Tunneling Diodes for Digital and Analog Applications with Reduced Circuit Complexity, Oct. 13–16, 1987.

D. Wang et al., "Image Segmentation Based on Oscillatory Correlation," Neural Computation, vol. 9, pp. 805–836 (1997).

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pp. 0672–0676.

Gang Li et al., "Maximum–Likelihood Diversity Combining in Partial–Band Noise Interference Channel," Department of Electrical and Computer Engineering, and Communication Research Centre, IEEE 1993, pp. 507–511.

METHOD AND APPARATUS FOR GENERATING PULSES FROM ANALOG WAVEFORMS

CROSS REFERENCE TO RELATED APPLICATIONS

This application is related to U.S. application Ser. No. 09/429,519 for A METHOD AND APPARATUS FOR COMMUNICATION USING PULSE DECODING, filed Oct. 28, 1999, U.S. application Ser.No. 09/429,527 for METHOD AND APPARATUS FOR GENERATING PULSES FROM ANALOG WAVEFORMS, filed Oct. 28, 1999, and U.S. application Ser.No. 09/805,845 for CIRCUITRY WITH RESISTIVE INPUT IMPEDANCE FOR GENERATING PULSES FROM ANALOG WAVEFORMS, filed Mar. 13, 2001, all of which are owned by the Assignee of the present invention, and herein incorporated by reference for all purposes.

BACKGROUND OF THE INVENTION

This invention relates generally to waveform to pulse conversion and more specifically to techniques for converting arbitrary analog waveforms to sequences of pulses.

Pulse generators are well known, for example, for DC controllers and other applications. However, the typical pulse generator is an adaptation of a conventional oscillator or monostable multivibrator, which can produce undesired or spurious transients when the pulse triggering is terminated. Such transients could be confused with trailing pulses, so that the counting of pulses is an inaccurate representation of the intended pulse count.

A typical pulse generator is responsive to a trigger related to a threshold level; that is, pulses are generated when a level input is applied that exceeds a predetermined threshold that has established a trigger point. The duration of the input above the threshold typically corresponds to the duration of the pulse train or oscillation period.

A classic van der Pol (vdP) oscillator is a simple nonlinear oscillator circuit and is a useful starting point for use as a pulse generator. However, the classic vdP oscillator is not readily controllable.

Circuitry is needed which is simple and yet which addresses needs in various applications. For example, in co-pending and co-owned U.S. application Ser.No. 09/429,527, a method and apparatus for generating pulses from analog waveforms are disclosed. The application discloses, in an embodiment of the invention, an analog waveform having two information regions used in a communication system. A first information region drives the operating point of the circuit to an unstable region to substantially instantly produce oscillations while a second information region will drive the operating point of the circuit out of the unstable region to stop the oscillations substantially instantaneously.

In a conventional communication system, however, various multilevel signaling schemes, such as QAM, are used to enhance the capacity of the information being transmitted through a given channel. Of course, this is done at the expenses of the noise performance of the communication system.

With the development of electronic technologies, it has now been determined that transmission of radio frequency signals at the frequency of modulation is both possible and practical over a broad spectrum, from subaudio frequencies to microwave frequencies. However, heretofore, there has not been a modulation and demodulation technology which takes advantage of this capability using multilevel signaling scheme.

It is desirable to have a pulse method and apparatus that addresses the foregoing needs.

SUMMARY OF THE INVENTION

According to the invention, a method and apparatus are provided for generating oscillations (groups of pulses) in response to input analog waveforms which involves exciting, with a known but arbitrary analog waveform, a circuit with a variable operating point and having a transfer function characterized by alternating unstable operating regions and stable operating regions. The circuit or device according to the invention is a form of oscillator having a multi-N-shaped or multi-S-shaped V-I profile that can be made to exhibit nonlinear operation; that is, to oscillate during excursion of current and voltage through one of the unstable operating regions.

BRIEF DESCRIPTION OF THE DRAWINGS

The invention will be better understood by reference to the following detailed description in connection with the accompanying drawings.

DESCRIPTION OF THE SPECIFIC EMBODIMENTS

Figure 1A:
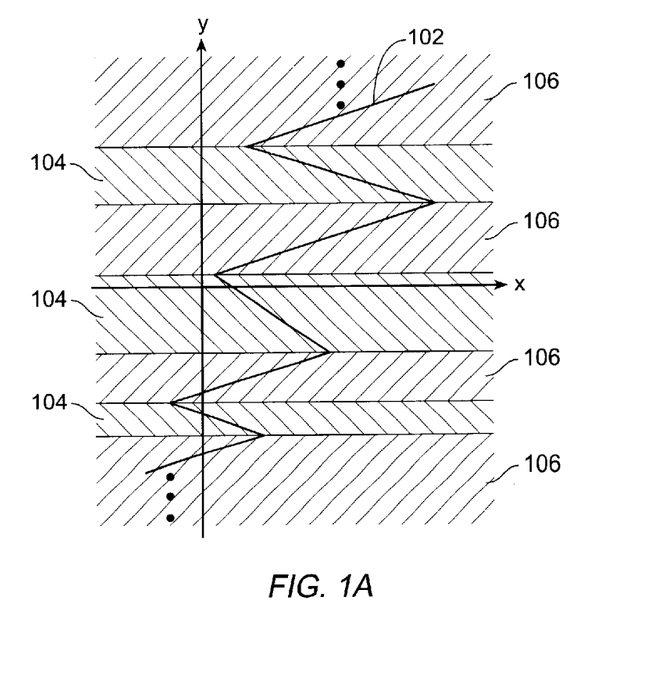
FIGS. 1A and 1B show two typical transfer functions having profiles contemplated by the invention.
Figure 1B:
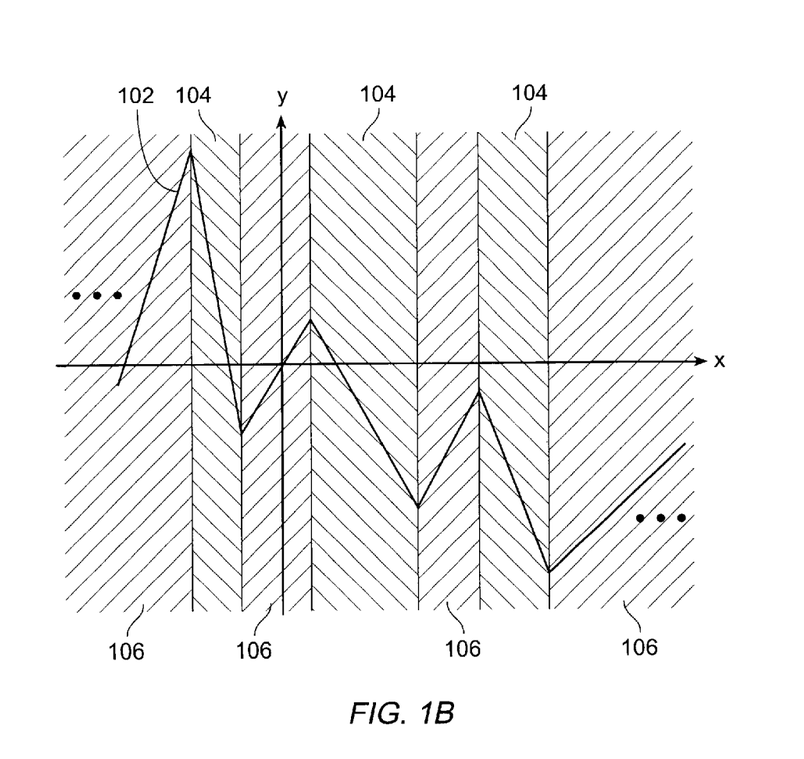

Referring to FIGS. 1A and 1B, circuits contemplated by the present invention exhibit a transfer function having either an S-shaped appearance such as shown in FIG. 1A or the N-shaped appearance shown in FIG. 1B. For the purposes of the present invention, the "transfer function" of a circuit refers to the relationship between any two state variables of a circuit. For example, electronic circuits are typically characterized by their I-V curves, relating the two state variables of current and voltage. Such curves indicate how one state variable (e.g., current) changes as the other state variable (voltage) varies.

Consider the general case, wherein the two state variables are represented by x and y, as shown in FIGS. 1A and 1B.

Transfer function 102 in FIGS. 1A and 1B each comprises piecewise functions which can be categorized into two categories. A piecewise function whose slope is positive $$\left(\text{i.e., } \frac{dy}{dx} > 0\right)$$

constitutes "stable" region portions 106 of the transfer function, whereas a negative slope $$\left(\text{i.e., } \frac{dy}{dx} < 0\right)$$

constitutes "unstable" region portions 104.

The circuit has an "operating point" located on the transfer function 102. The nature of the output of the circuit depends on the location of its operating point. When the operating point lies in an unstable region 104, the circuit exhibits oscillatory behavior. When the operating point is moved to a stable region 106, the circuit will exhibit a generally time-varying but non-oscillatory behavior. The operating point can be controlled by a driving function to produce a selectable number of oscillations by forcing the operating point to different locations within an unstable region. For this reason, this circuit can be referred to as a "controlled" oscillator. Generally, the transfer function in FIG. 1A and the driving function are governed by the following coupled equations:

$$\frac{dx}{dt} = f(t) - ky \quad (1)$$

$$\varepsilon \frac{dy}{dt} = x - \Psi(y) \quad (2)$$

The dual of Equations (1) and (2) can be used to describe the relation between the driving function and the transfer function in FIG. 1B. The coupled equations read as follows:

$$\frac{dy}{dt} = f(t) - kx \quad (3)$$

$$\varepsilon \frac{dx}{dt} = y - \Psi(x) \quad (4)$$

In both cases, $f(t)$ is the driving function. The parameter $\varepsilon$ and $k$ are dependent on the circuit parameters. The function $\Psi(\ )$ describes the relationship between the two state-variables x and y. The location of the operating point at any time along the transfer function 102 can be determined by setting $$\frac{dx}{dt} = 0 \text{ and } \frac{dy}{dt} = 0$$

in the coupled equations described above.

Figure 2:
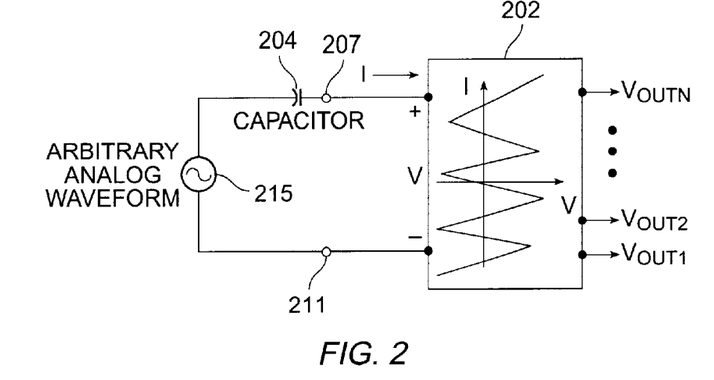
FIGS. 2 and 3 are schematic diagrams of circuit arrangements for forcing the operating point between the various stable and unstable regions of the circuit.

Referring now to FIG. 2, a circuit configuration shows schematically how coupled Equations (1) and (2) can be realized. The transfer function relating the input current I and input voltage V in a circuit block 202 has a multi-S-shaped profile. The circuit block 202 includes inputs 207 and 211, and multiple output voltage ports $V_{out1}, V_{out2}, \ldots, V_{outN}$. A capacitive element 204 (e.g., capacitor, varactor, etc.) is connected at one end to the input 207. An arbitrary analog waveform source 215 is connected between input 211 and the other end of capacitive element 204, to fully integrate the circuit.

The number of output voltage ports corresponds to the number of "unstable" regions in the I-V characteristic (i.e., transfer function) associated with the circuit 202. In other words, if there are N unstable regions in circuit 202, there will be N output voltage ports. Moreover, as will be further explained below, each unstable region k has an associated output voltage port $V_{outk}$.

In the circuit configuration shown in FIG. 2, the location of the operating point on the transfer function of the circuit is a function of the slope of analog waveform produced by analog waveform source 215. More specifically, the rate of change of the voltage and capacitive element 204 determines whether the operating point of the circuit 202 is in an unstable or a stable region of the transfer function. If the operating point is in a stable region, the output voltage at each port $V_{out1}, V_{out2}, \ldots, V_{outN}$ is simply a function of the arbitrary analog waveform source 215. There is no oscillatory behavior in any of the ports. However, in accordance with the invention, if the operating point is driven into the $k^{th}$ unstable region, then output voltage port $V_{outk}$ will exhibit a substantially instantaneous occurrence of oscillatory behavior. Further in accordance with the invention, the other output voltage ports remain silent.

Figure 3:
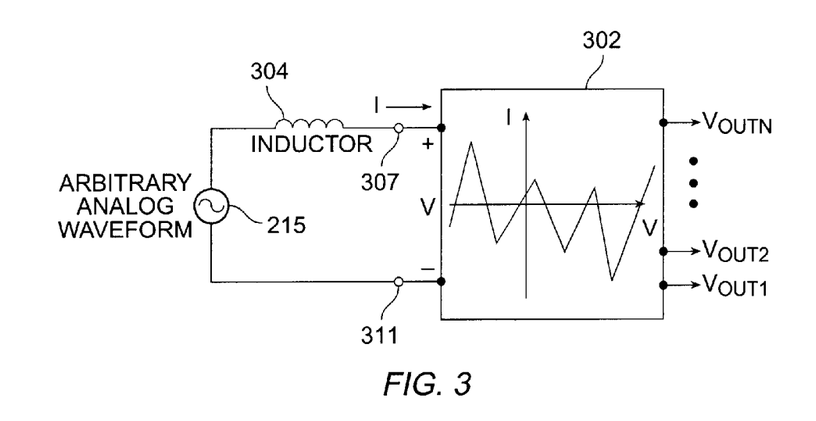

The coupled Equations (3) and (4) can be realized by the circuit configuration depicted in FIG. 3. In FIG. 3, the transfer function relating the input current I and input voltage V of a circuit block 302 has a multi-N-shaped profile. This configuration can be considered as the dual of the circuit configuration shown in FIG. 2.

The circuit block 302 includes inputs 307 and 311. The circuit includes plural output voltage ports $V_{out1}, V_{out2}, \ldots, V_{outN}$. Instead of capacitive element 204 as shown in FIG. 2, the circuit configuration of FIG. 3 includes an inductive element 304 connected at one end to the input 307. An arbitrary analog waveform source 215 is connected between input 311 and the other end of inductive element 304, to complete the circuit.

As in FIG. 1, the number of output voltage ports of circuit block 302 corresponds to the number of "unstable" regions in the I-V characteristic (i.e., transfer function) associated with the circuit. If there are N unstable regions in circuit 302, there will be N output voltage ports. As with the circuit in FIG. 2, each unstable region k has an associated output voltage port $V_{outk}$.

Unlike the circuit configuration of FIG. 2, the location of the operating point on the transfer function of the circuit of FIG. 3 is a function of the amplitude of analog waveform produced by analog waveform source 215. More specifically, the amplitude of the voltage V appearing across both the analog waveform source and inductor determines whether the operating point of the circuit 302 is in an unstable or a stable region of the transfer function. If the operating point. is in a stable region, the output voltage at each port $V_{out1}, V_{out2}, \ldots, V_{outN}$ is simply a function of the arbitrary analog waveform source 215. There is no oscillatory behavior in any of the ports. However, in accordance with the invention, if the operating point is driven into the $k^{th}$ unstable region, then output voltage port $V_{outk}$ will exhibit a substantially instantaneous occurrence of oscillatory behavior. Further in accordance with the invention, the other output voltage ports remain silent.

Figure 4:
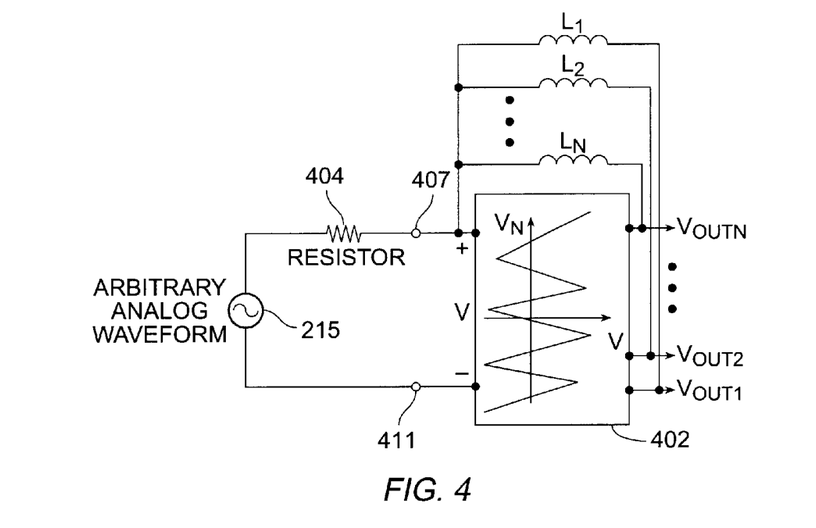
FIGS. 4 and 5 show typical circuit configurations in accordance with the invention having resistive input impedances.
Figure 5:
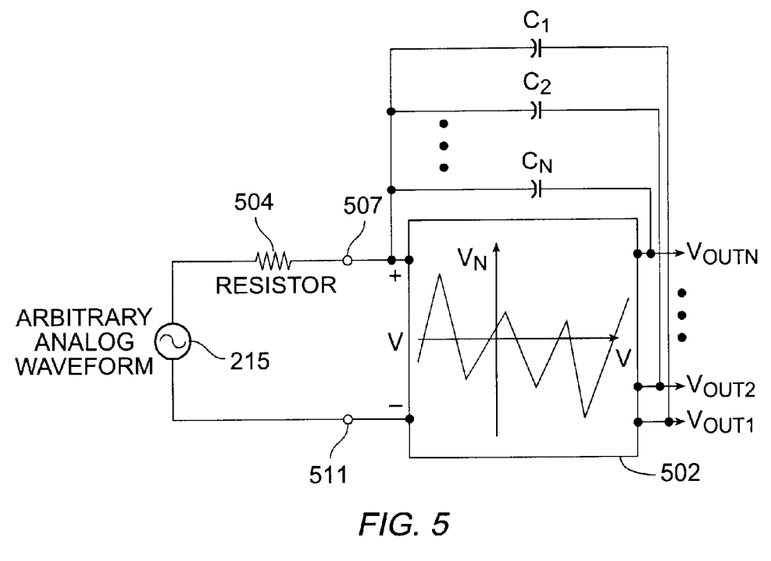

The input impedance of each of the circuit configurations in FIGS. 2 and 3 is reactive; i.e. frequency dependent. Referring to FIGS. 4 and 5, circuit configurations equivalent to those in FIGS. 2 and 3, respectively, are shown having resistive input impedances. The advantage of the circuits shown in FIGS. 4 and 5 is that the input impedances are independent of the frequency of the input signal.

Referring to FIG. 4, the circuit configuration shown is equivalent to that shown in FIG. 2. The circuit block 402 includes inputs 407 and 411, and multiple output voltage ports $V_{out1}, V_{out2}, \ldots, V_{outN}$. A resistive element 404 is connected at one end to the input 407. An arbitrary analog waveform source 215 is connected between input 411 and the other end of resistive element 404. Each output voltage port $V_{out1}, V_{out2}, \ldots, V_{outN}$ has an associated inductive $L_1$, $L_2, \ldots, L_N$ coupling the port back to input 407, to complete the circuit.

The operating point is driven in the same manner as in FIG. 2, namely as a function of the slope of the analog waveform. The multi-S-shaped transfer function for circuit block 402 is the same as that of circuit block 202. However, the state variables are different. The state variables for circuit block 402 are V and $V_N$. V is the input voltage across inputs 407 and 411, and $V_N$ can be expressed as follows:

$$V_N = \sum_{k=1}^{N} V_k = \sum_{k=1}^{N} V - V_{outk} \tag{5}$$

where $V_{out1}, \ldots, V_{outk}, \ldots, V_{outN}$ are the output voltages at the output ports of the circuit block 402.

FIG. 5 depicts a circuit configuration having a resistive input impedance that is equivalent to that shown in FIG. 3. The circuit block 502 includes inputs 507 and 511. The circuit includes plural output voltage ports $V_{out1}, V_{out2}, \ldots, V_{outN}$. A resistive element 504 is connected at one end to the input 507. An arbitrary analog waveform source 215 is connected between input 511 and the other end of resistive element 504. Each output voltage port $V_{out1}, V_{out2}, \ldots, V_{outN}$ has an associated capacitive element $C_1, C_2, \ldots, C_N$ coupling the port back to input 507, to complete the circuit.

Like the circuit of FIG. 3, the operating point of this circuit is driven by the amplitude of the analog waveform. The multi-N-shaped transfer function in this case relates $V_N$ and V where $V_N$ is defined by Equation (5). The topology of the circuit is similar to that in FIG. 4, except that all of the inductors connecting the input 507 to voltage outputs are replaced by capacitors $C_1 \ldots C_N$.

Simulations and actual circuit experiments have been carried out to realize the circuit configurations illustrated in FIGS. 2 to 5. Following are typical circuits and experimental results.

Figure 6:
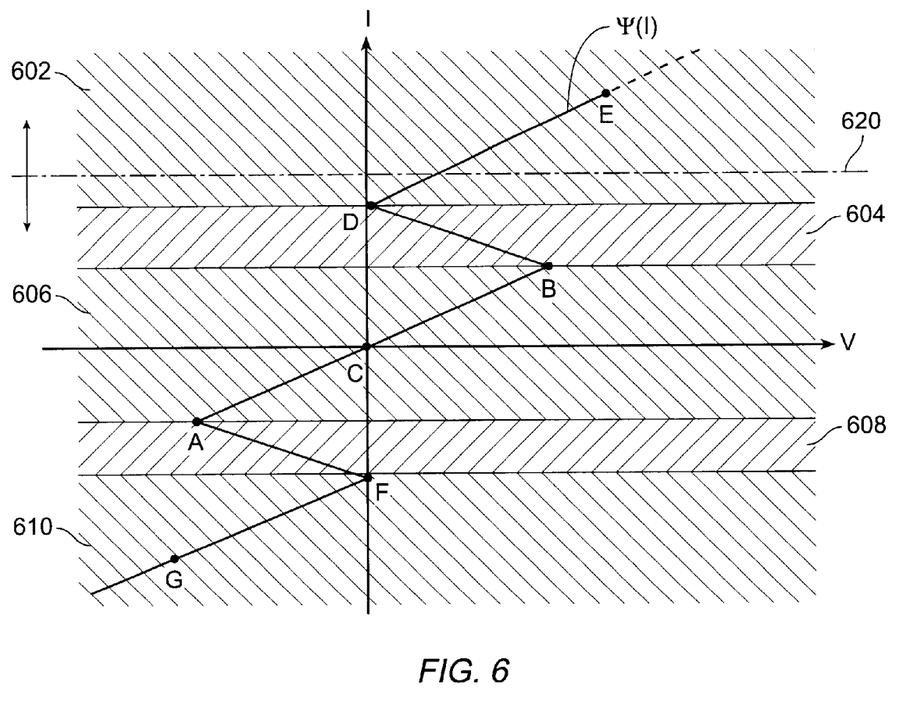
FIG. 6 is a transfer function of the circuit shown in FIG. 2.

FIG. 6 shows a double-S-shaped I-V transfer function to be used to simulate the circuit configuration described in FIG. 2. The simulation follows the dynamics described by Equations (1) and (2). By replacing the state variables x and y to I and V and including the circuit parameters, Equations (1) and (2) can be rewritten as follows:

$$\frac{dV}{dt} = \frac{dV_s}{dt} - \frac{I}{C} \tag{6}$$

$$\varepsilon \frac{dI}{dt} = V - \Psi(I) \tag{7}$$

$\varepsilon$ is a small parameter due to circuit parasitics and is usually much smaller than the capacitor 205. Note that $\Psi(I)$ is the function describing the double-S-shaped transfer function shown in FIG. 6. The double-S-shaped transfer function starts and ends with stable regions 602 and 610 respectively. There are two unstable regions 604 and 608 and one stable region 606. As can be seen in FIG. 6, the stable and unstable regions are arranged in alternating fashion.

As discussed in connection with FIG. 2, the operating point is driven by the slope of the analog waveform source $V_s$. A close inspection of the transfer function shown in FIG. 6 reveals that there is a positive-slope portion of $V_s$ and a negative-slope portion of $V_s$ which will cause the circuit to oscillate. This is due to the fact that there are unstable regions in both I>0 plane and the I<0 plane. From Equations (6) and (7), setting $$\frac{dV}{dt} = 0,$$

produces a horizontal line 620 that intersects $\Psi(I)$. The intersection constitutes the operating point of the circuit along the transfer function. By setting $$\frac{dV}{dt} \text{ and } \frac{dI}{dt}$$

equal to zero (or in general setting the time first derivative of the state variables to zero) is equivalent to looking at steady state solution or asymptotic solution. The horizontal line 620 is defined by $$I = \frac{dV_s}{dt} \times C.$$

As $V_s$ varies, so will its derivatives $$\frac{dV_s}{dt}$$

(i.e., slope of $V_s$), and so the line 620 will be displaced along the vertical as shown in FIG. 6. For certain positive slope values, the line will intersect the transfer function along segments DB, thus causing the circuit to produce oscillations. Likewise, for certain negative slope values, the line will intersect the transfer function along segments AF, thus causing the circuit to produce oscillations.

Figure 7:
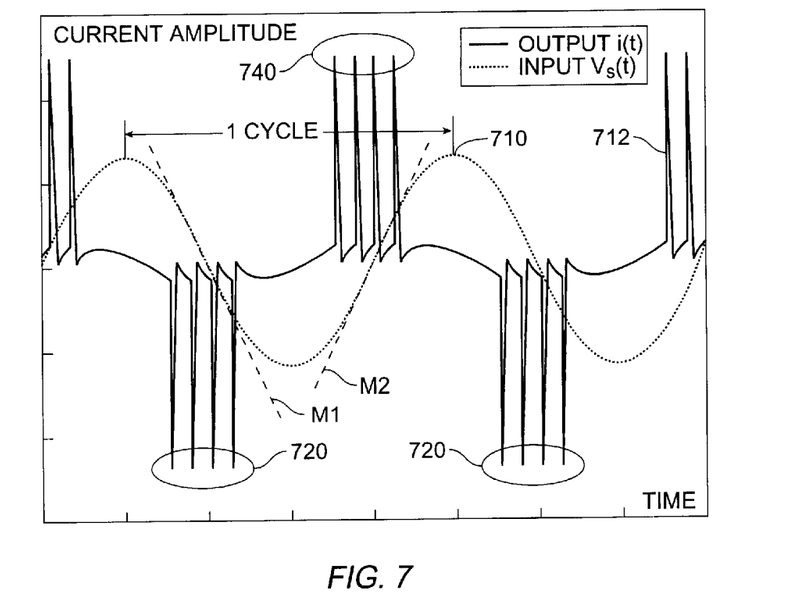
FIG. 7 is a trace obtained by the simulation of Equations 6 and 7.

FIG. 7 shows the results of simulations using the coupled Equations (6) and (7). The analog waveform $V_s(t)$ is sinusoidal and is shown in FIG. 7 as a dotted trace 710. The transfer function $\Psi(I)$ is shown in FIG. 6. The current I is shown in FIG. 7 as a solid trace 712. As noted above, the current trace shows oscillations (spikes 720) when a negative slope $M_1$ of $V_s$ falls within a certain range. Similarly, the current trace shows oscillations (spikes 740) when a positive slope $M_2$ of $V_s$ falls within a certain range. The group of spikes 720 and 740 in FIG. 7 are the result of moving the operating point into unstable region 608 and 604, respectively.

Figure 8A:
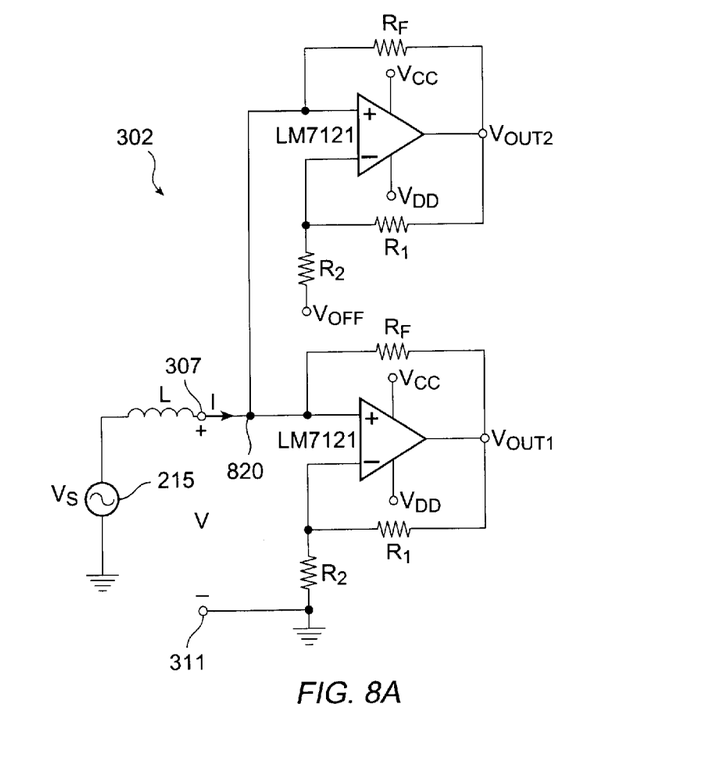
FIGS. 8A and 8B illustrate examples of circuits having a multiple-N-shaped transfer function.

Turning now to FIG. 8A, an illustrative example of an embodiment of the circuit block 302 shown in FIG. 3 is shown, where N is equal to 2. Recall, the circuit 302 exhibits a transfer function having a double-N-shaped I-V profile. The circuit comprises two circuit portions. In the illustrative embodiment, each circuit portion includes an LM7121 op-amp. A positive feedback path is provided through resistive element $R_f$. A negative feedback path is provided by resistors $R_1$ and $R_2$, configured as voltage divider. The input 307 is coupled to the positive input of each op-amp. The input 311 is coupled to ground. The output of each op-amp corresponds to one of the output voltage ports $V_{out1}, V_{out2}, \ldots, V_{outN}$. In this illustrative embodiment, the two output voltage ports are $V_{out1}$ and $V_{out2}$.

Typical circuit parameters for each circuit portion are as follows: $V_{CC}$ and $V_{DD}$ are 3V and −1.5V respectively. $V_{OFF}$ is 0.75 V. $R_F$ is 1 kΩ, $R_1$ is 68 Ω and $R_2$ is 10Ω. L is 220

μH. These are typical circuit parameters, shown merely to illustrate one embodiment of the invention, and should not be construed as limiting. It is understood that the circuit portions could be designed with different parameters and still achieve circuit operation in accordance with the invention without undue experimentation.

Figure 9:
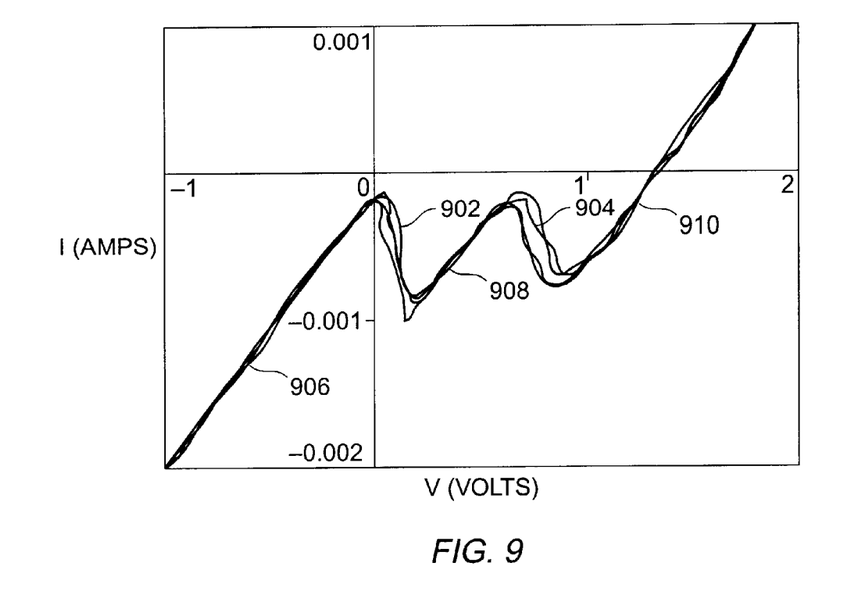
FIG. 9 is the transfer curve of the circuit shown in FIG. 8A.

The I-V characteristic (transfer function) for the circuit of FIG. 8A is shown in FIG. 9. The I-V characteristic comprises two segments 902, 904 which are unstable regions. There are three segments 906, 908, 910 which are the stable regions. The circuit is configured so that the stable and unstable regions are arranged in alternating fashion.

Figure 10:
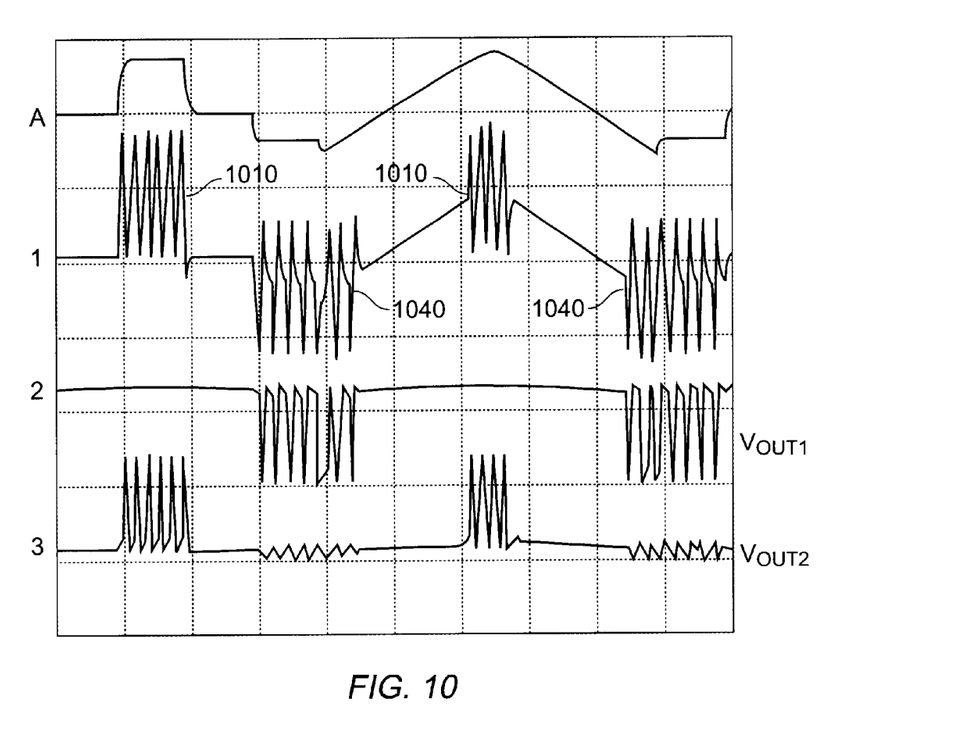
FIG. 10 shows the response of the circuit of FIG. 8A to various analog waveforms.

FIG. 10 shows some of the traces obtained from the circuit of FIG. 8A. Trace A is the analog waveform generated by the source 215. Trace 1 is the probed signal at the input 820 in FIG. 8A. Groups of pulses 1010 and 1040 shown in FIG. 10 are produced by forcing the operating point into the unstable region 904 and 902 respectively. This can be verified by observing the signal at $V_{out1}$ and $V_{out2}$ of the circuit in FIG. 8A. Oscillations will only be observed in $V_{out1}$ when the operating point is in unstable region 902. Similarly, when the operating point is in unstable region 904, oscillations can only be observed at the output of $V_{out2}$. Otherwise, $V_{out1}$ and $V_{out2}$ will be silent. This behavior can be seen by the traces shown in FIG. 10.

Figure 8B:
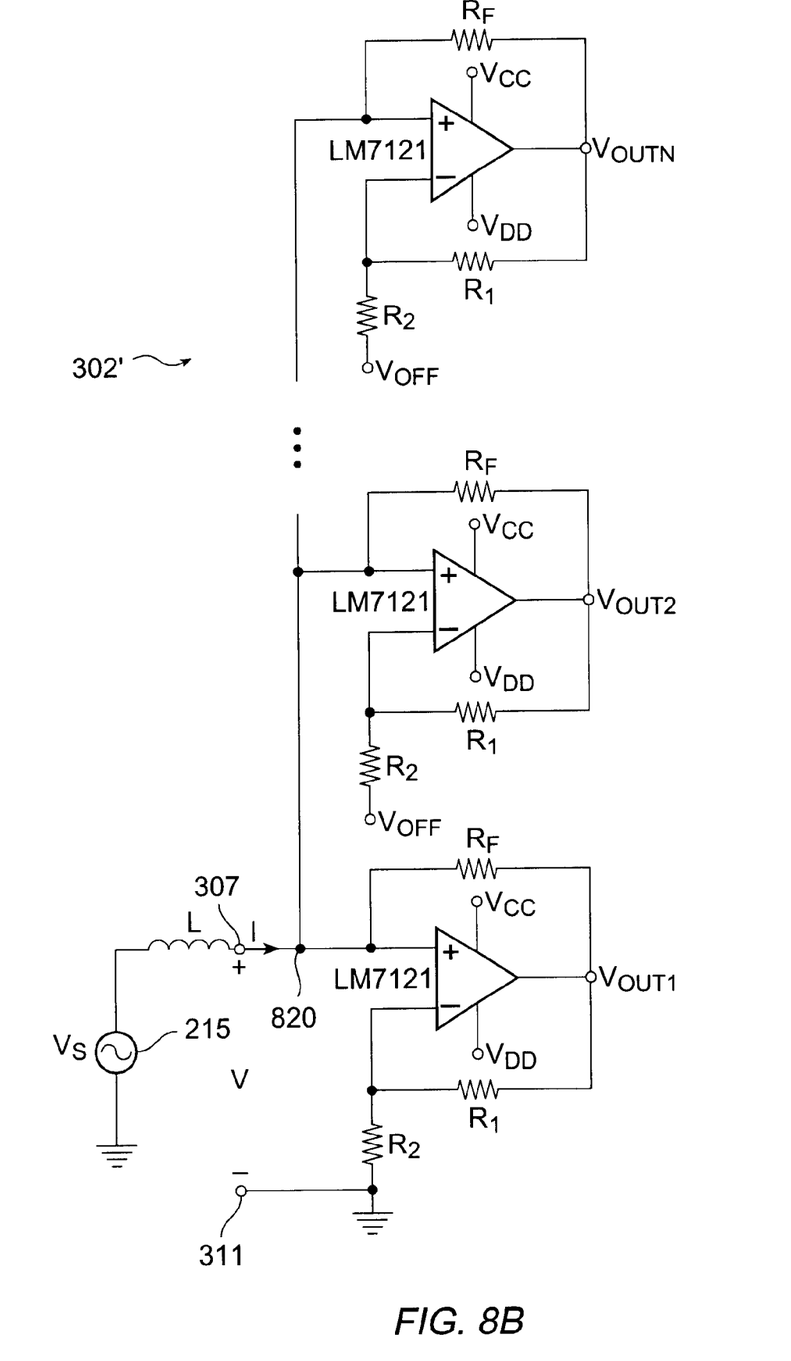

FIG. 8A shows a circuit having two unstable regions. A more general configuration is shown in FIG. 8B, where N circuit portions are assembled to provide a circuit block 302 having N unstable regions. The output of each circuit portion corresponds to one of the N output voltage ports $V_{out1}$, $V_{out2}$, ..., $V_{outN}$.

The observation is made that it is well within the scope of an artisan of ordinary skill to use other conventional circuit designs and configurations to produce a multi-N-shaped transfer function as taught by the present invention. The circuit of FIG. 8A and of FIG. 8B are merely examples illustrating typical embodiments of the invention.

Figure 11:
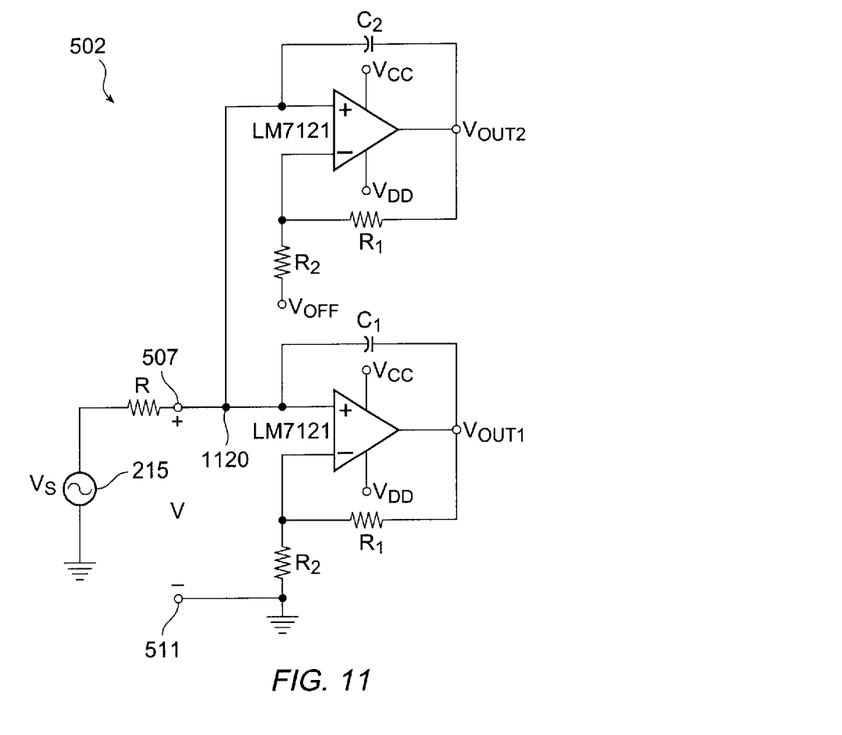
FIG. 11 illustrates other examples of circuits in accordance with the invention.

Turn now to FIG. 11 for an illustrative example of an embodiment of the circuit block 502 shown in FIG. 5, where N is equal to 2. The circuit of FIG. 11 exhibits a $V_N$–V transfer function having a double-N-shaped profile. The circuit comprises two circuit portions. In the illustrative embodiment shown in FIG. 11, each circuit portion includes an LM7121 op-amp. A positive feedback path is provided through a capacitive element $C_1$ ($C_2$). A negative feedback path is provided by resistors $R_1$ and $R_2$, configured as voltage divider. The input 507 is coupled to the positive input of each op-amp. The input 511 is coupled to ground. The output of each op-amp corresponds to one of the output voltage ports $V_{out1}$, $V_{out2}$, ..., $V_{outN}$. In this illustrative embodiment, the two output voltage ports are $V_{out1}$ and $V_{out2}$.

In this case, $V_N=(V-V_{out1})+V-V_{out2})$. Typical circuit parameters for each circuit portion are as follows: the resistors values R, $R_1$, and $R_2$ are 1.2 kΩ, 68 Ω, and 10 Ω respectively. Capacitors $C_1$ and $C_2$ have the same value that is 150 pF. The biasing voltage $V_{CC}$, $V_{DD}$ and $V_{OFF}$ are 3.5 V, −1.5 V, and 1.0 V respectively. These are typical circuit parameters, shown merely to illustrate an embodiment of the invention and should not be limiting. It is understood that the circuit portions could be designed with different parameters and still achieve circuit operation in accordance with the invention without undue experimentation.

Figure 12:
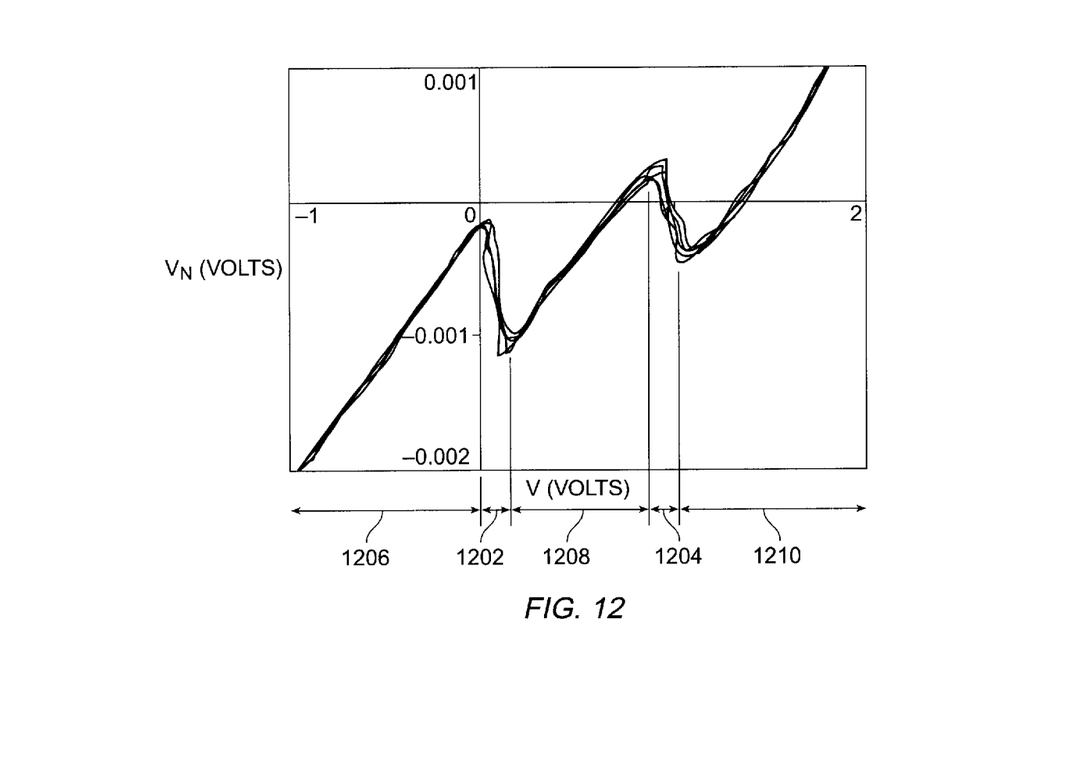
FIG. 12 shows the transfer of the circuit of FIG. 11.

FIG. 12 shows the double-N-shaped transfer function which characterizes the circuit in FIG. 11. The transfer function comprises two unstable regions 1202 and 1204 and three stable regions 1206, 1208, and 1210, arranged in alternating fashion.

Figure 13:
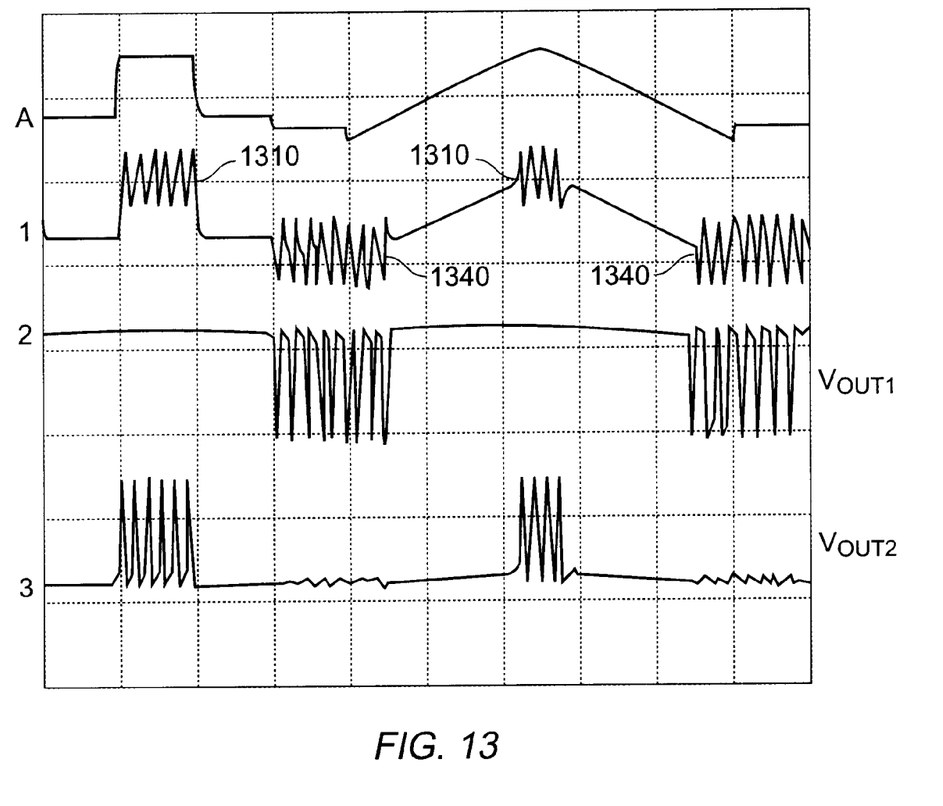
FIG. 13 shows the response of the circuit of FIG. 11 to various analog waveforms.

FIG. 13 shows the traces obtained by probing various nodes in the circuit. Trace A is the input waveform from analog waveform source 215. Trace 1 is the voltage at terminal 1120. Whenever the operating point is in any unstable region, oscillations are observed in terminal 1120. For this particular case, oscillations 1310 and 1340 occur when the operating point is in unstable region 1202 and 1204 respectively. Trace 2 is probed at $V_{out1}$ and Trace 3 is probed at $Vout_2$. At $V_{out1}$, it is expected that the oscillations only appear when the operating point is in unstable region 1202, otherwise it is showing silences. Similarly, at $V_{out2}$, oscillations are only seen when the operating point is in unstable region 1204.

Figure 14:
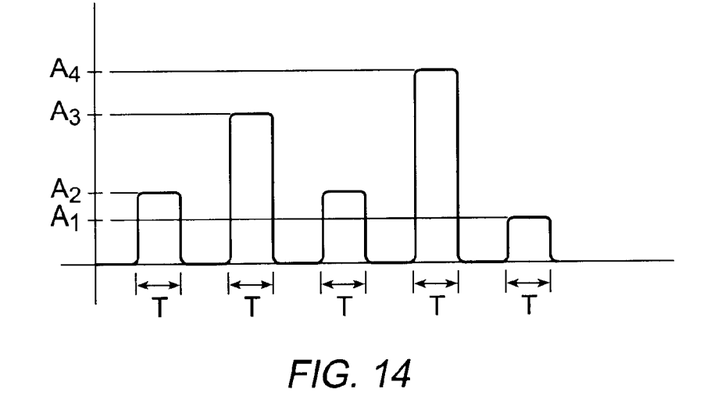
FIG. 14 illustrates an example of waveforms with varying amplitude.

Referring back to FIGS. 1B and 3, and to FIG. 14, the discussion turns to an explanation of how circuits according to the present invention can be utilized for transmitting and receiving information. Consider the multiple-N-shaped transfer function of FIG. 1B and its corresponding circuit 302 shown schematically in FIG. 3, for example. A circuit according to the invention has a transfer function comprising two or more unstable operating regions and two or more stable operating regions, , each unstable region producing unique oscillatory output. The amplitude of an applied waveform serves as a "forcing" agent which moves the operating point of the circuit into the circuit's unstable and stable operating states 104, 106. Thus, the circuit can be tuned such that the waveform amplitudes A1 and A2 of the waveforms shown FIG. 14 force the circuit into one of the unstable operating regions to produce oscillatory output, e.g. pulses.

This forms the basis for information encoding and decoding. A circuit according to the invention can be built such that it is characterized by having plural unstable regions separated by plural stable regions. In the case of a the circuit whose operating point is forced as a function of the amplitude of an excitation signal, a set of excitation signals (e.g., square waves) can be provided each having an unique amplitude to represent a different information symbol. Applying an excitation signal to the circuit produces a corresponding group of pulses. Each such group of pulses, in turn, corresponds to an information symbol; e.g., a character from an alphabet.

Figure 15:
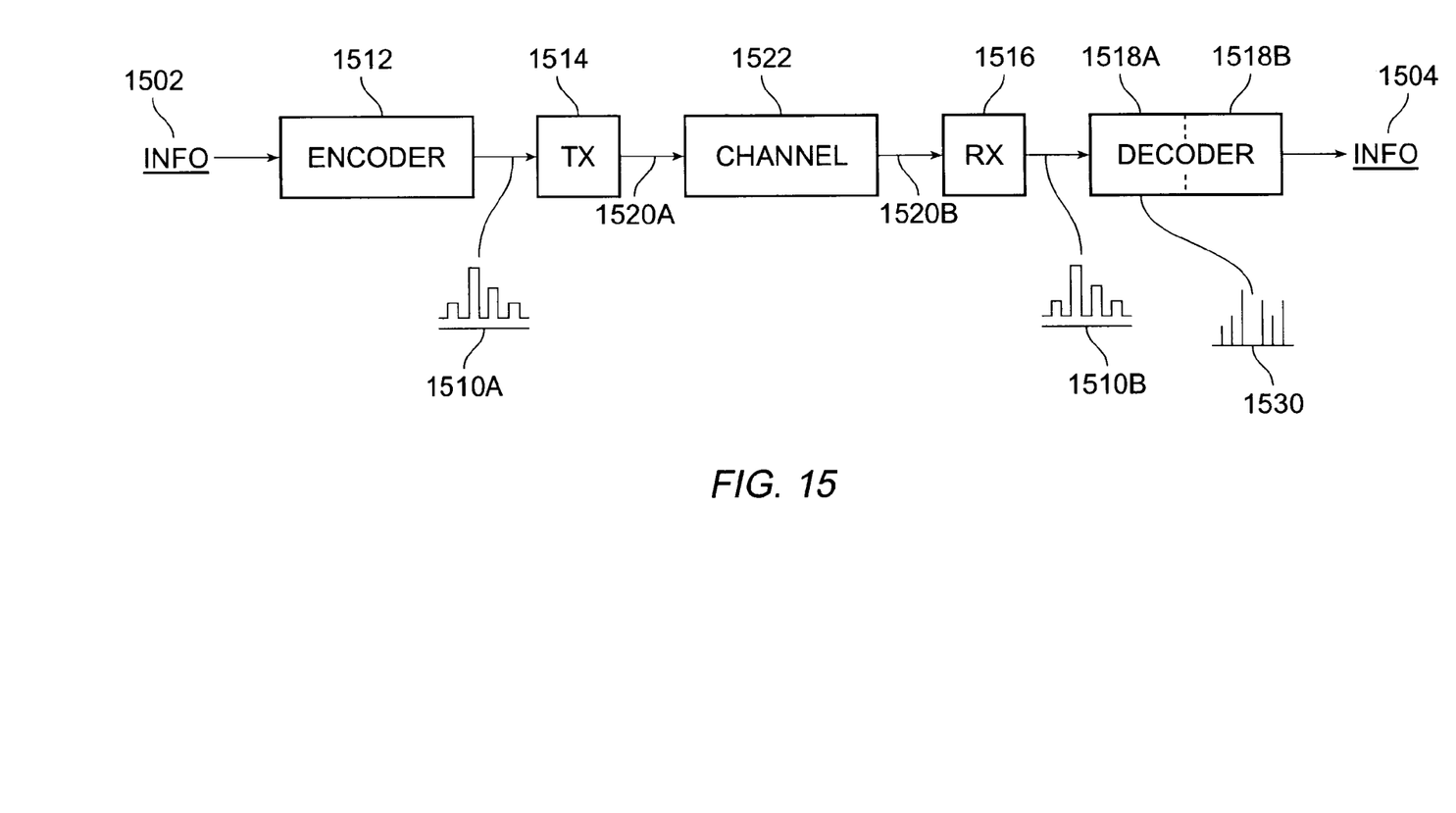
FIG. 15 is a system block diagram of a communication system in accordance with the invention.

Referring to FIG. 15, a communication system based on the information encoding and decoding using techniques of the present invention includes at the transmitting end, an encoder 1512 for encoding information 1502 in the form of a series of square waves (more generally, an analog waveform) 1510A, as an illustrative example. Other waveforms can be used here, including but not limited to sinusoidal waveforms, triangle waveforms, sawtooth waveform, and the like. The waveform can be symmetric or asymmetric.

The encoded information 1510A (i.e., analog waveform) is fed into a conventional transmitter device 1514. The encoded information 1510A is transformed (e.g., modulated with a carrier signal or simply amplification before transmission) to produce a channel-optimized transmission signal 1520A that is suitable for transmission over a channel 1522. For example, the transmitter device may be radio transmission subsystem wherein the encoded information is modulated onto a carrier wave and transmitted as a radio signal. As another example, the transmitter device may be a modem, transmitting over a telephone line.

A receiver device 1516 detects the received signal 1520B and transforms (e.g., demodulates) the received signal to reproduce the encoded information 1510B (i.e., analog waveform). The recovered information is feed into the front end of a decoding unit 1518A. The front end unit 1518A includes circuitry according to the invention for producing a plurality of groups of pulses 1530. Each group of pulses is then mapped to a character in an alphabet to yield an information symbol. In one embodiment of the invention, the number of pulses in each group of pulses are simply counted to recover information 1504. For example, a pulse count of 1 can by definition represent a first symbol, a pulse count of 2 maps to a second symbol, and so on. Pulse counting circuits are known. Additional implementations for the decision device can be found in co-pending and co-owned U.S. application Ser. No. 09/805,854, filed Mar. 13, 2001.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Although the present invention has been described in terms of specific embodiments, it should be apparent to those skilled in the art that the scope of the present invention is not limited to the described specific embodiments.

Further, while the present invention has been described using a particular combination of hardware and software, it should be recognized that other combinations of hardware and software are also within the scope of the present invention. The present invention may be implemented only in hardware or only in software or using combinations thereof, depending on performance goals and other criteria not relevant to the invention.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for generating pulses, comprising:
providing a circuit having a transfer function comprising two or more unstable operating regions and two or more stable operating regions, said circuit having an operating point;
exciting said circuit with a first signal, said operating point being forced to a first of said unstable regions in response thereto to produce first oscillations; and
exciting said circuit with a second signal different from said first signal, said operating point being forced to a second of said unstable regions in response thereto to produce second oscillations different from said first oscillations.

2. The method of claim 1 further including providing said first oscillations at a first output terminal of said circuit and providing said second oscillations at a second output terminal of said circuit.

3. The method of claim 2 wherein said second output terminal is absent oscillations when said first output terminal is providing said first oscillations, and said first output terminal is absent oscillations when said second output terminal is providing said second oscillations.

4. The method of claim 1 wherein said unstable regions and said stable regions are arranged in alternating fashion.

5. The method of claim 4 wherein said unstable regions are bounded by said stable regions.

6. The method of claim 1 wherein said circuit is sensitive to an amplitude of an excitation signal, said operating point being forced to one of said unstable regions depending on said amplitude.

7. The method of claim 1 wherein said circuit is sensitive to a slope of an excitation signal, said operating point being forced to one of said unstable regions depending on said slope.

8. A method for generating pulses, comprising:
receiving a first analog waveform, a first portion of which has a first slope;
applying said first analog waveform to a circuit characterized by having two or more unstable operating regions and two or more stable operating regions, said circuit having an operating point;
in response to said first slope, forcing said operating point to a first of said unstable regions to produce first pulses;
receiving a second analog waveform, a portion of which corresponds to said first portion and which has a second slope different from said first slope;
applying said second analog waveform to said circuit; and
in response to said second slope, forcing said operating point to a second of said unstable regions to produce second pulses.

9. The method of claim 8 wherein said first pulses are produced at a first output terminal of said circuit and said second pulses are produced at a second output terminal of said circuit.

10. The method of claim 9 wherein said second output terminal is absent pulses when said first output terminal is producing said first pulses, and said first output terminal is absent pulses when said second output terminal is producing said second pulses.

11. The method of claim 8 wherein said unstable regions and said stable regions are arranged in alternating fashion.

12. The method of claim 11 wherein said unstable regions are bounded by said stable regions.

13. A method for producing information from analog waveforms, comprising:
providing a circuit having at least two unstable operating regions separated by a stable operating region;
applying a first analog waveform to said circuit, and in response thereto forcing said circuit to operate in a first of said unstable operating regions to produce first oscillations;
producing a first symbol based on said first oscillations;
applying a second analog waveform to said circuit, and in response thereto forcing said circuit to operate in a second of said unstable operating regions to produce second oscillations; and
producing a second symbol based on said second oscillations,
wherein said information comprises said first and second symbols.

14. The method according to claim 13 wherein said first and second oscillations, each is a group of one or more pulses.

15. The method according to claim 13 wherein said analog waveforms are cyclical.

16. The method of claim 13 wherein said analog waveforms are selected from the group consisting of sinusoidal, ramp, asymmetric, sawtooth, square and channel-optimized symbol.

17. The method according to claim 13 wherein said analog waveforms are cyclical and wherein said cycles comprise mixtures of different waveform types, including time-varying channel-optimized symbols.

18. The method of claim 13 further including providing said first oscillations at a first output terminal of said circuit and providing said second oscillations at a second output terminal of said circuit.

19. The method of claim 18 wherein said second output terminal is absent oscillations when said first output terminal is providing said first oscillations, and said first output terminal is absent oscillations when said second output terminal is providing said second oscillations.

20. The method of claim 13 wherein said unstable regions and said stable regions are arranged in alternating fashion.

21. The method of claim 20 wherein said unstable regions are bounded by said stable regions.

22. The method of claim 13 wherein said circuit is sensitive to amplitudes of said analog waveforms, said operating point being forced to one of said unstable regions depending on said amplitudes.

23. The method of claim 13 wherein said circuit is sensitive to a slopes of said analog waveforms, said operating point being forced to one of said unstable regions depending on said slopes.

24. A device for producing pulses, comprising;
an input for receiving signals;
a circuit coupled to said input, said circuit having at least two unstable operating regions and at least two stable operating regions; and
an output coupled to said circuit for outputting pulses,
said circuit responsive to sensing a first signal to operate in one of said unstable operating regions to produce first pulses,
said circuit further responsive to sensing a second signal to operate in another of said unstable operating regions to produce second pulses different from said first pulses.

25. The device according to claim 24 wherein said stable and said unstable operating regions are arranged in alternating fashion.

26. The device according to claim 24 wherein said unstable operating regions are bounded by said stable operating regions.

27. The device according to claim 24 wherein said circuit is sensitive to amplitudes of said signals.

28. The device according to claim 24 wherein said circuit is sensitive to slopes of said signals.

29. The device according to claim 24 wherein said output comprises a first output terminal for outputting said first pulses and a second output terminal for outputting said second pulses.

30. The device according to claim 24 wherein said circuit includes a first circuit portion to produce said first pulses in response to said first signal and a second circuit portion to produce said second pulses in response to said second signal.

31. The device according to claim 30 wherein said output comprises a first output terminal coupled to said first circuit portion to output said first pulses substantially exclusive of said second pulses, and a second output terminal coupled to said second circuit portion to output said second pulses substantially exclusive of said first pulses.

32. The device according to claim 31 wherein said first output terminal and said second output terminal are in electrical communication at a node, whereby said node produces said first and second pulses.

33. The device according to claim 30 wherein said circuit further includes at least a third circuit portion to produce third pulses different from said first and said second pulses, and wherein said output comprises a first output terminal coupled to said first circuit portion, a second output terminal coupled to said second circuit portion, and a third output terminal coupled to said third circuit portion.

34. A device for producing information from analog waveforms, comprising;
a circuit having a first unstable region separated from a second unstable region by a stable region, said circuit having an input terminal for receiving said analog waveforms, said circuit having first and second output terminals; and
a decoder coupled to receive said first and second output terminals,
said circuit configured to operate in said first unstable region in response to receiving a first analog waveform to produce first oscillations at said first output terminal,
said decoder, in response to detecting said first oscillations, producing a first symbol,
said circuit further configured to operate in said second unstable region in response to receiving a second analog waveform to produce second oscillations at said second output terminal,
said decoder, in response to detecting said second oscillations, producing a second symbol.

35. The device according to claim 34 wherein said first and second oscillations each comprises a group of one or more pulses.

36. The device according to claim 34 wherein said circuit is sensitive to amplitudes of said analog waveforms.

37. The device according to claim 34 wherein said circuit is sensitive to slopes of said analog waveforms.

38. The device according to claim 34 wherein said circuit further includes a node to which said first output terminal and said second output terminal are in electrical connection, said node producing said first and said second oscillations.

* * * * *